United States Patent
Kim et al.

(10) Patent No.: US 12,234,178 B2
(45) Date of Patent: Feb. 25, 2025

(54) ELECTRONIC DEVICE COMPRISING HIGH HARDNESS COLOR STRUCTURE LAYER

(71) Applicant: Samsung Electronics Co., Ltd., Gyeonggi-do (KR)

(72) Inventors: Sejin Kim, Gyeonggi-do (KR); Jinchoul Park, Gyeonggi-do (KR); Junsang Park, Gyeonggi-do (KR); Wanju Shin, Gyeonggi-do (KR); Hwanju Jeon, Gyeonggi-do (KR); Younggoo Kang, Gyeonggi-do (KR); Yoojin Kim, Gyeonggi-do (KR); Gijea Park, Gyeonggi-do (KR); Yunhui Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 934 days.

(21) Appl. No.: 17/311,390

(22) PCT Filed: Dec. 3, 2019

(86) PCT No.: PCT/KR2019/016881
§ 371 (c)(1),
(2) Date: Jun. 7, 2021

(87) PCT Pub. No.: WO2020/122490
PCT Pub. Date: Jun. 18, 2020

(65) Prior Publication Data
US 2022/0024815 A1    Jan. 27, 2022

(30) Foreign Application Priority Data
Dec. 12, 2018 (KR) .......................... 10-2018-0160145

(51) Int. Cl.
| | | |
|---|---|---|
| C03C 17/34 | (2006.01) | |
| G02B 5/00 | (2006.01) | |
| H05K 5/03 | (2006.01) | |

(52) U.S. Cl.
CPC .......... *C03C 17/3435* (2013.01); *G02B 5/003* (2013.01); *H05K 5/03* (2013.01);
(Continued)

(58) Field of Classification Search
CPC ................................................ C03C 2217/213
See application file for complete search history.

(56) References Cited

U.S. PATENT DOCUMENTS 9,335,444 B2    5/2016   Hart et al.
9,726,786 B2    8/2017   Hart et al.
(Continued)

FOREIGN PATENT DOCUMENTS

JP    2009-084143 A    4/2009
JP    2010-072347 A    4/2010
(Continued)

OTHER PUBLICATIONS

Korean Office Action dated Aug. 22, 2023.
Notice of Patent Granted dated Feb. 1, 2024.

*Primary Examiner* — Ian A Rummel
(74) *Attorney, Agent, or Firm* — Cha & Reiter, LLC

(57) ABSTRACT

An electronic device according to various embodiments of the disclosure may include a housing including a first plate forming an outer face. The first plate may include a glass plate including a first surface outwardly facing the housing and a second surface inwardly facing the housing, a coating layer including an anti-reflection coating and/or an anti-finger coating above the first surface while forming the outer face, a first layer formed between the first surface of the first glass plate and the coating layer, having a first thickness, and
(Continued)

including a first inorganic material, a second layer formed between the first layer and the coating layer, having a second thickness, and including a second inorganic material different from the first inorganic material, a third layer formed between the second layer and the coating layer, having a third thickness thicker than each of the first thickness and the second thickness, and including a third inorganic material, and an opaque layer formed on the second surface. Various other embodiments may also be possible.

15 Claims, 14 Drawing Sheets

(52) U.S. Cl.
CPC .. *C03C 2217/213* (2013.01); *C03C 2217/281* (2013.01); *C03C 2217/734* (2013.01); *C03C 2217/76* (2013.01); *C03C 2218/154* (2013.01)

(56) References Cited

U.S. PATENT DOCUMENTS

| | | |
|---|---|---|
| 2002/0001724 A1 | 1/2002 | Anderson et al. |
| 2014/0134397 A1 | 5/2014 | Amin et al. |
| 2017/0184762 A1* | 6/2017 | Fujii ................... G02B 1/10 |
| 2018/0352668 A1 | 12/2018 | Amin et al. |
| 2020/0012362 A1 | 1/2020 | Kim et al. |

FOREIGN PATENT DOCUMENTS

| | | |
|---|---|---|
| JP | 2018-506851 A | 3/2018 |
| KR | 10-0723636 B1 | 6/2007 |
| KR | 10-2017-0143398 A | 12/2017 |
| KR | 10-2018-0088157 A | 8/2018 |

* cited by examiner

ELECTRONIC DEVICE COMPRISING HIGH HARDNESS COLOR STRUCTURE LAYER

CROSS REFERENCE TO RELATED APPLICATIONS

This application is a National Phase Entry of PCT International Application No. PCT/KR2019/016881, which was filed on Dec. 3, 2019, and claims a priority to Korean Patent Application No. 10-2018-0160145, which was filed on Dec. 12, 2018, the contents of which are incorporated herein by reference.

TECHNICAL FIELD

Various embodiments of the disclosure relate to a color structure constructed on an outer surface of an electronic device.

BACKGROUND ART

Hydrophobic-oleophobic or hycrophibic-oleophilic coating may be applied on a glass constituting an exterior of a housing of an electronic device to prevent contamination of fingerprints and foreign substances on a surface in an outward direction. Such a coating scheme may use, for example, a wet or dry scheme.

In order to differentiate a design, a layer may be formed in an inward direction of the glass to implement a color/texture. A scheme of implementing the color/texture may be a method in which a printing film is attached to the glass in the inward direction, or is finished on a back face (rear face) of the glass without a film through color deposition or printing, or painting or the like.

DISCLOSURE OF INVENTION

Technical Problem

However, when implementing a color of an exterior housing, the color or pattern is viewed through a glass material. Therefore, since a texture of an original material of glass is revealed, it may be difficult to implement a ceramic or metal texture.

In addition, in order to provide the ceramic or metal texture, the texture of the original material shall be covered by performing deposition on the outer face of the glass. For this, an E-beam deposition facility may be used, but a thin film formed by using the E-beam deposition tends to be easily peeled off due to poor hardness, strength, and adhesion.

In addition, if the color is implemented not in a deposition manner but in a printing manner, durability such as a scratch or the like is weaker than that of a bare glass when finished with a printing film. If an anti-wear layer is formed above the printing layer by using deposition, the anti-wear layer may be easily broken or peeled off due to a weak support layer.

In addition, if color implementation uses not a method of using a dielectric thin film but a coating method which uses a material-specific color, for example, a metal nitride (TiN, AlN, TiAlN, etc.), a metal carbide (TiC, CrC, TiSiC, etc.), a metal nitride carbide (TiCN, etc.), or the like, there is a limitation in implementing various colors other than silver, black, gray, and gold series, and a conductive property appears depending on a composition ratio. If a surface coating material becomes conductive, radio wave transmission/reception performance may deteriorate when a terminal communicates with another electronic device or a base station or the like.

This may lead to a significant communication performance problem in $5^{th}$ Generation (5G) communication (including mmWave) using a rear (or front) Radio Frequency (RF) radiation, and may lead to performance deterioration and performance deviation even in communication using rear RF radiation (e.g., NFC communication, etc.). For this reason, only a limited color representation is possible.

An electronic device according to various embodiments of the disclosure may provide a color structure which implements a ceramic or metal texture of a glass material and solves a durability problem.

An electronic device according to various embodiments of the disclosure may provide a color structure in an electronic device having an RF radiation structure in a rear face (or a front face) during communication (5G including mmWave, NEC, etc.).

Solution to Problem

An electronic device according to various embodiments of the disclosure may include a housing including a first plate forming an outer face. The first plate may include a glass plate including a first surface outwardly facing the housing and a second surface inwardly facing the housing, a coating layer including an anti-reflection coating and/or an anti-finger coating above the first surface while forming the outer face, a first layer formed between the first surface of the first glass plate and the coating layer, having a first thickness, and including a first inorganic material, a second layer formed between the first layer and the coating layer, having a second thickness, and including a second inorganic material different from the first inorganic material, a third layer formed between the second layer and the coating layer, having a third thickness thicker than each of the first thickness and the second thickness, and including a third inorganic material, and an opaque layer formed on the second surface.

An electronic device according to various embodiments of the disclosure may include a housing including an outer plate forming an outer face. The outer plate may include a transparent substrate including a first surface outwardly facing the housing and a second surface inwardly facing the housing, an anti-contamination layer formed above the first surface while forming the outer face, a color structure layer formed between the first surface of the transparent substrate and the anti-contamination layer, and an anti-wear layer formed of an inorganic material between the color structure layer and the anti-contamination layer.

Advantageous Effects of Invention

An electronic device according to the disclosure can provide a color structure which represents a ceramic or metal texture on a surface of an outer plate and has improved durability.

An electronic device according to the disclosure can provide a color structure on a rear face of a housing without obstacles of communication (e.g., 5G including mmWave, NEC).

BEST MODE FOR CARRYING OUT THE INVENTION

Figure 1:
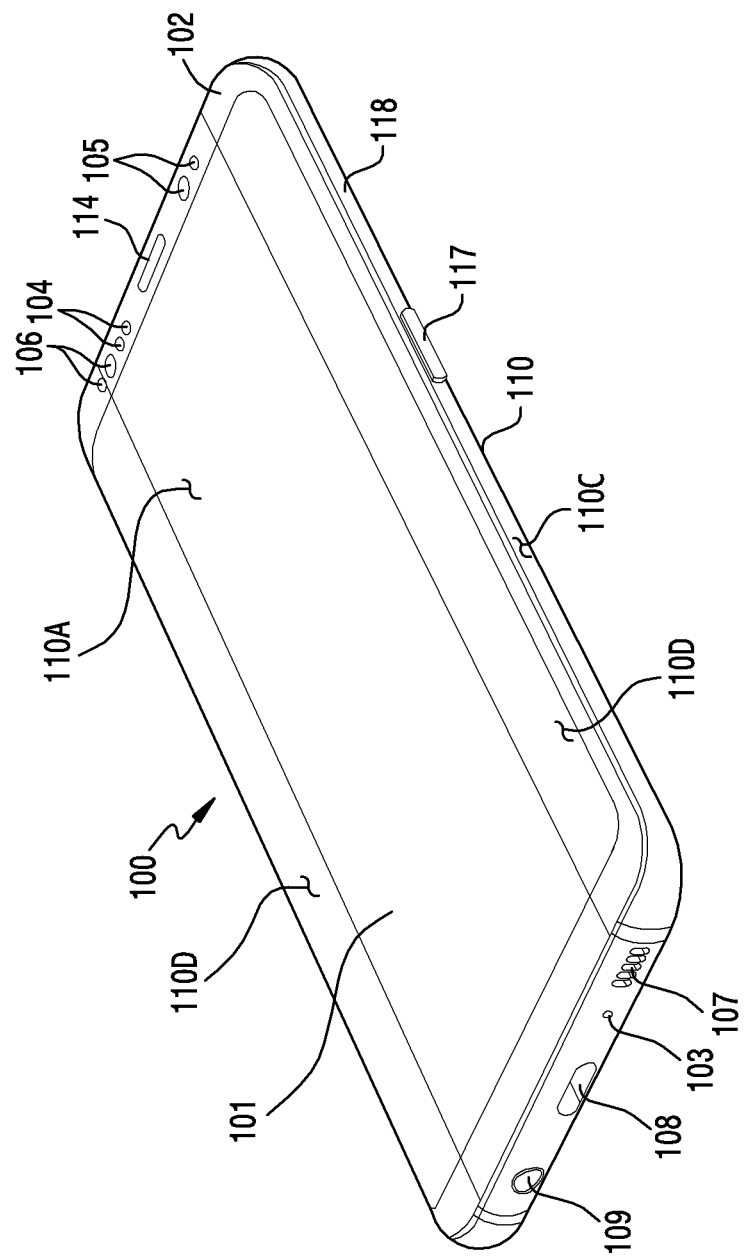
FIG. 1 is a front perspective view of an electronic device according to various embodiments.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An electronic device according to various embodiments of the disclosure may include at least one of, for example, a smartphone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

Figure 2:
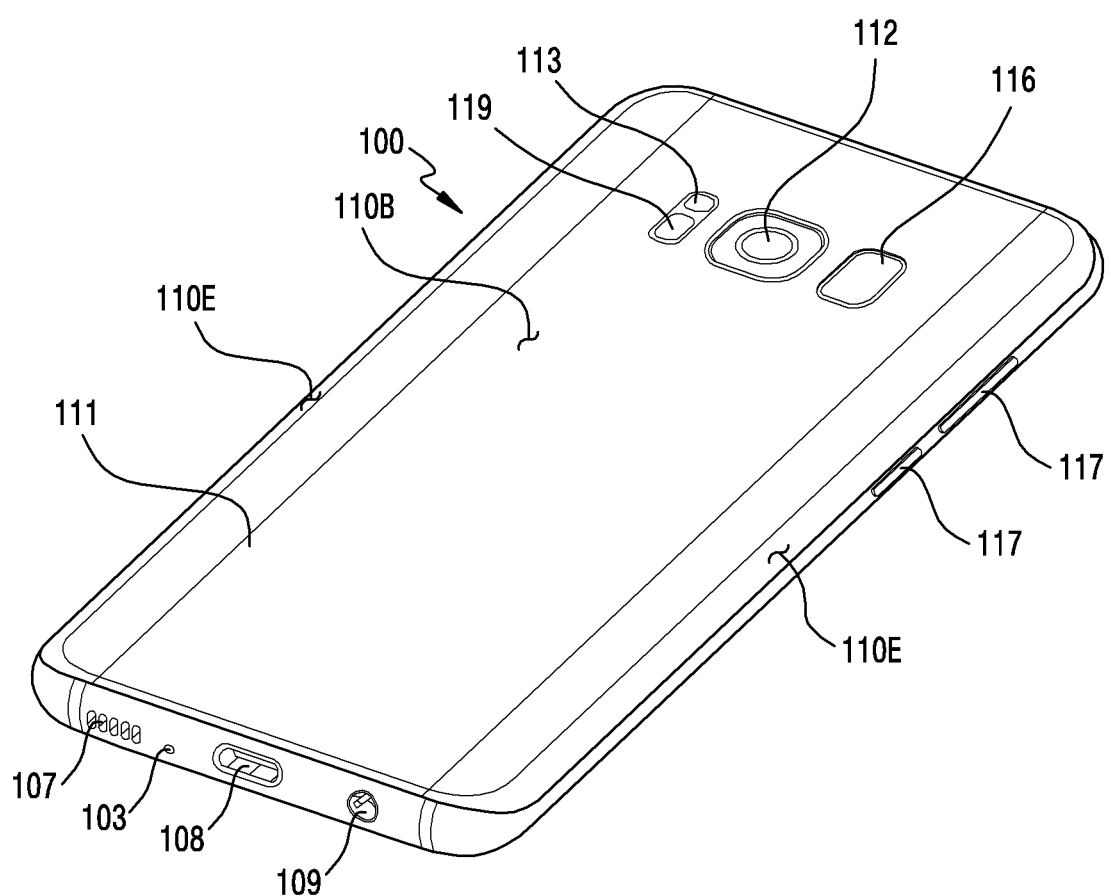
FIG. 2 is a rear perspective view of the electronic device of FIG. 1.

FIG. 1 is a front perspective view of an electronic device according to various embodiments. FIG. 2 is a rear perspective view of the electronic device of FIG. 1.

Referring to FIG. 1 and FIG. 2, an electronic device 100 according to an embodiment may include a housing 110 including a first face (or a front face) 110A, a second face (or a rear face) 110B, and a lateral face 110C surrounding a space between the first face 100A and the second face 110B. In another embodiment (not shown), the housing may refer to a construction which constitutes part of the first face 110A, second face 110B, and third face 110C of FIG. 1. According to an embodiment, the first face 110A may be constructed of a front plate 102 (e.g., a polymer plate or a glass plate having various coating layers) which is at least partially transparent in practice. The second face 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of the these materials. The lateral face 110C may be constructed of a lateral bezel structure (or a "lateral member") 118 bonded to the front plate 102 and the rear plate 111 and including metal and/or polymer. In some embodiments, the rear plate 111 and the lateral bezel structure 118 may be constructed integrally and may include the same material (e.g., a metallic material such as aluminum).

In the illustrated embodiment, the front plate 102 may include two first regions 110D seamlessly extended by being bent from the first face 110A toward the rear plate 111 at both ends of a long edge of the front plate 102. In the illustrated embodiment (see FIG. 2), the rear plate 111 may include two second regions 110E seamlessly extended by being bent from the second face 110B toward the front plate 102 at both ends of a long edge. In some embodiments, the front plate 102 (or the rear plate 111) may include only one of the first regions 110D (or the second regions 110E). In another embodiment, some of the first regions 110D or the second regions 110E may not be included. In the above embodiments, in a lateral view of the electronic device 100, the lateral bezel structure 118 may have a first thickness (or width) at a lateral face in which the first regions 110D or the second regions 110E are not included, and may have a second thickness thinner than the first thickness at a lateral face in which the first regions 110E or the second regions 110E are included.

According to an embodiment, the electronic device 100 may include at least one or more of a display 101, audio modules 103, 107, and 114, sensor modules 104, 116, and 119, camera modules 105, 112, and 113, a key input device 117, a light emitting element 106, and connector holes 108 and 109. In some embodiments, the electronic device 100 may omit at least one of components (e.g., the key input device 117 or the light emitting element 106), or other components may be additionally included.

The display 101 may be exposed through, for example, some portions of the front plate 102. In some embodiments, at least a part of the display 101 may be exposed through the first face 110A and the front plate 102 constructing the first regions 110E of the lateral face 110C. In some embodiments, a corner of the display 101 may be constructed to be substantially the same as an outer boundary adjacent to the front plate 102. In another embodiment (not shown), in order to expand an area in which the display 101 is exposed, the display 110 and the front plate 102 may be constructed to have substantially the same interval between outer boundaries thereof.

In another embodiment (not shown), a part of a screen display region of the display 101 may have a recess or opening, and may include at least one or more of the audio module 114, sensor module 104, camera module 105, and light emitting element 106 which are aligned with the recess or the opening may be included. In another embodiment (not shown), at least one of the audio module 114, the sensor module 104, the camera module 105, the fingerprint sensor 116, and the light emitting element 106 may be included in a rear face of the screen display region of the display 101. In another embodiment (not shown), the display 101 may be disposed adjacent to or joined with a touch sensing circuit, a pressure sensor capable of measuring touch strength (pressure), and/or a digitizer for detecting a magnetic-type stylus pen. In some embodiments, at least a part of the sensor modules 104 and 119 and/or at least a part of the key input device 117 may be disposed to the first regions 110D and/or the second regions 110E.

The audio modules 103, 107, and 114 may include the microphone hole 103 and the speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole 107 and the communication receiver hole 114. In some embodiments, the speaker holes 107 and 114 and the microphone hole 103 may be implemented with one hole, or the speaker (e.g., a piezo speaker) may be included without the speaker holes 107 and 114.

The sensor modules 104, 116, and 119 may generate an electrical signal or data value corresponding to an internal operational state of the electronic device 100 or an external environmental state. The sensor modules 104, 116, and 119 may include, for example, the first sensor module 104 (e.g., a proximity sensor) and/or second sensor module (not shown) (e.g., a fingerprint sensor) disposed to the first face 110A of the housing 110, and/or the third sensor module 119 (e.g., a Heart Rate Monitoring (HRM) sensor) disposed to the second face 110B of the housing 110 and/or the fourth sensor module 116 (e.g., a fingerprint sensor). The fingerprint sensor may be disposed not only to the first face 110A (e.g., the display 101) but also the second face 110B of the housing 110. The electronic device 100 may further include at least one of senor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor 104.

The camera modules 105, 112, and 113 may include the first camera device 105 disposed to the first face 110A of the electronic device 100, the second camera device 112 disposed to the second face 110B, and/or the flash 113. The camera module 105 and 112 may include one or more lenses, an image sensor, and/or an image signal processor. The flash 113 may include, for example, a Light Emitting Diode (LED) or a xenon lamp. In some embodiments, two or more lenses (wide angle and telephoto lenses) and image sensors may be disposed to one face of the electronic device 100.

The key input device 117 may be disposed to the lateral face 110C of the housing 110. In another embodiment, the electronic device 100 may not include the entirety or part of the aforementioned key input device 117. The key input device 117, which is not included, may be implemented on a display 101 in a different form such as a soft key or the like. In some embodiments, the key input device may include the sensor module 116 disposed to the second face 110B of the housing 110.

The light emitting element 106 may be disposed, for example, to the first face 110A of the housing 110. The light emitting element 106 may provide, for example, state information of the electronic device 100 in an optical form. In another embodiment, the light emitting element 106 may provide, for example, a light source interworking with an operation of the camera module 105. The light emitting element 106 may include, for example, an LED, an IR LED, and a xenon lamp.

The connector holes 108 and 109 may include the first connector hole 108 capable of housing a connector (e.g., a USB connector) for transmitting/receiving power and/or data of an external electronic device and/or the second connector hole (e.g., earphone jack) 109 capable of housing a connector for transmitting/receiving an audio signal with respect to the external electronic device.

Figure 3:
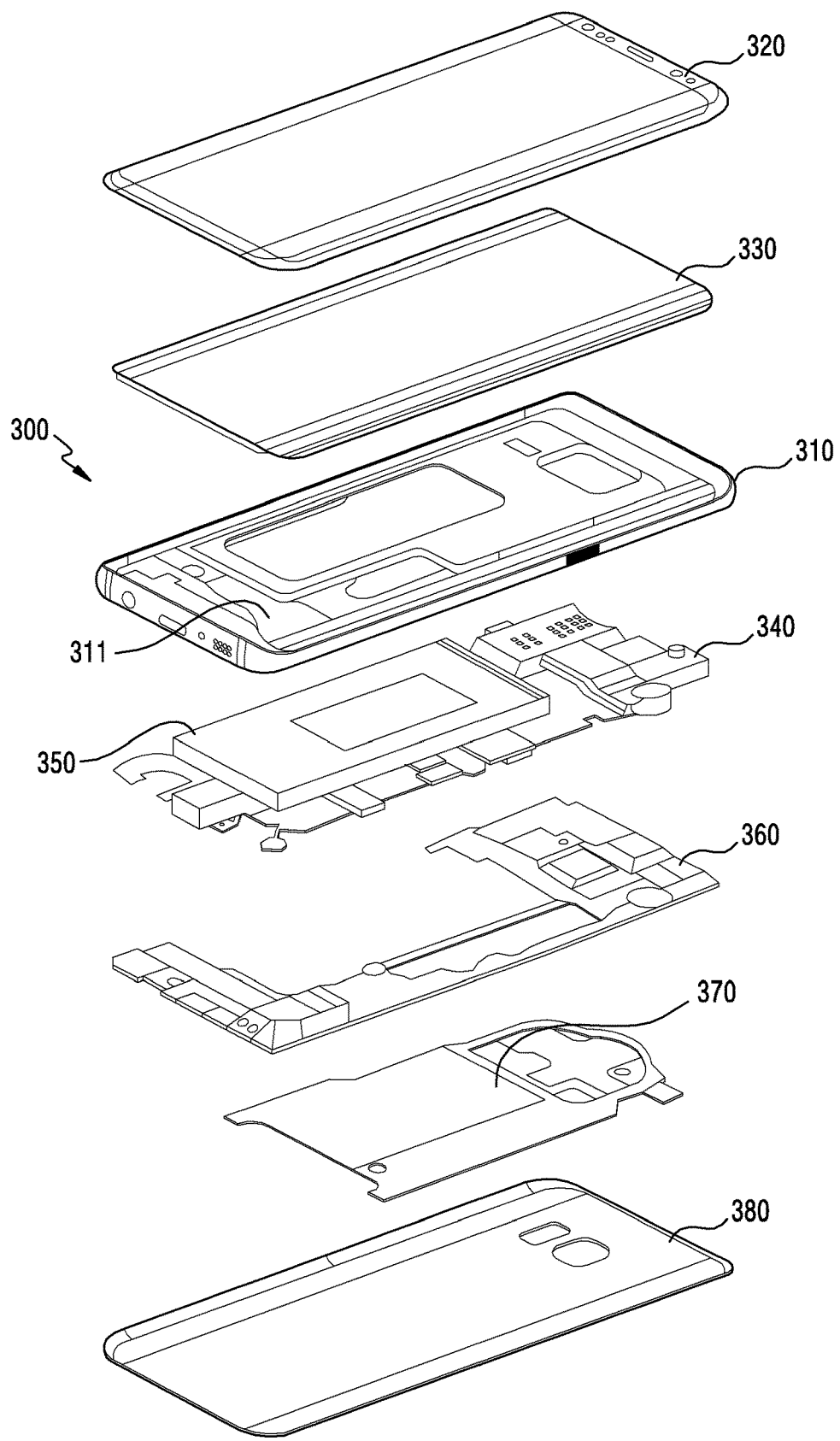
FIG. 3 is an exploded perspective view illustrating an inner structure of the electronic device of FIG. 1.

FIG. 3 is an exploded perspective view illustrating an inner structure of the electronic device of FIG. 1.

Referring to FIG. 3, an electronic device 300 (e.g., the electronic device 100 of FIG. 1 and FIG. 2) may include a lateral bezel construction 310, a first support member 311 (e.g., a bracket), a front plate 320, a display 330, a printed circuit board 340, a battery 350, a second support member 360 (e.g., a rear case), an antenna 370, and a rear plate 380. In some embodiments, the electronic device 300 may omit at least one (e.g., the first support member 311) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the lateral bezel construction 310 by being disposed inside the electronic device 300, or may be constructed integrally with respect to the lateral bezel construction 310. The first support member 311 may be constructed of, for example, a metal material and/or non-metal material (e.g., polymer). The display 330 may be bonded to one face of the first support member 311, and the printed circuit board 340 may be bonded to the other face thereof. A processor, a memory, and/or an interface may be mounted on the printed circuit board 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 300 and the external electronic device, and may include a USB connector, an SD card/MMC connector, or an audio connector.

As a device for supplying power to at least one component of the electronic device 300, the battery 350 may include, for example, a non-rechargeable primary cell, a rechargeable secondary cell, or a fuel cell. At least a part of the battery 350 may be disposed on the same plane substantially with respect to, for example, the printed circuit board 340. The battery 350 may be disposed integrally inside the electronic device 300, or may be detachably disposed with respect to the electronic device 300.

The antenna 370 may be disposed between the rear plate 380 and the battery 350. The antenna 370 may include, for example, a Near Field Communication (NEC) antenna, a wireless charging antenna, and/or a Magnetic Secure Transmission (MST) antenna. The antenna 370 may perform NEC, for example, with the external electronic device, or may wirelessly transmit/receive power required for charging. In another embodiment, an antenna construction may be constructed by at least a part of the lateral bezel construction 310 and/or the first support member 311 or a combination thereof.

Figure 4:
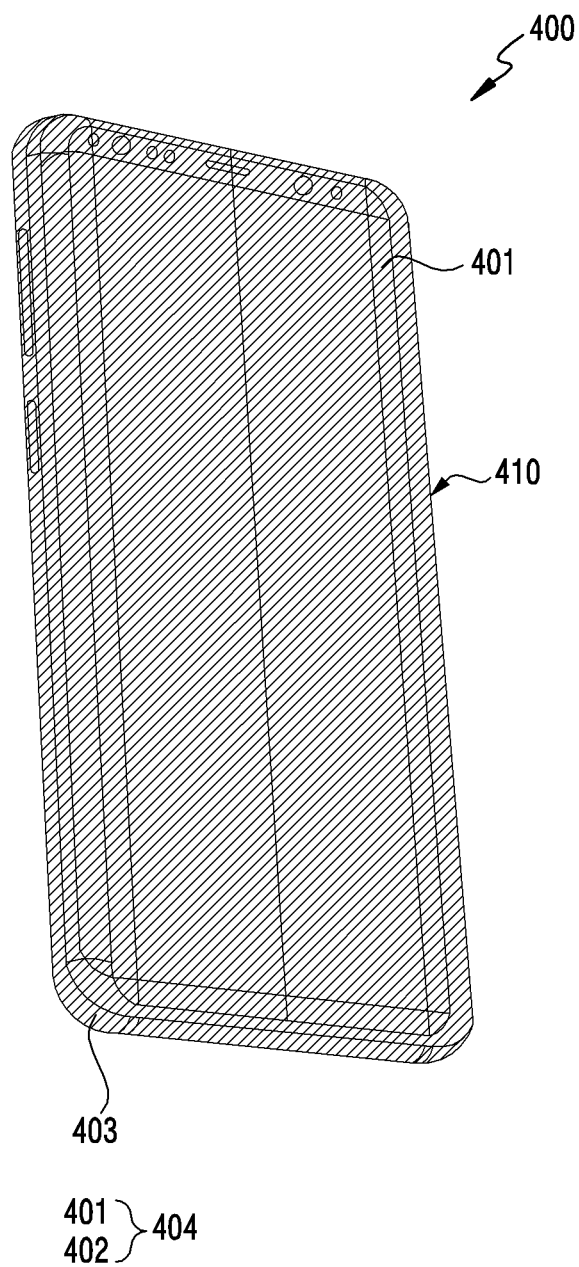
FIG. 4 is a perspective view illustrating a front plate of an electronic device according to various embodiments.
Figure 5:
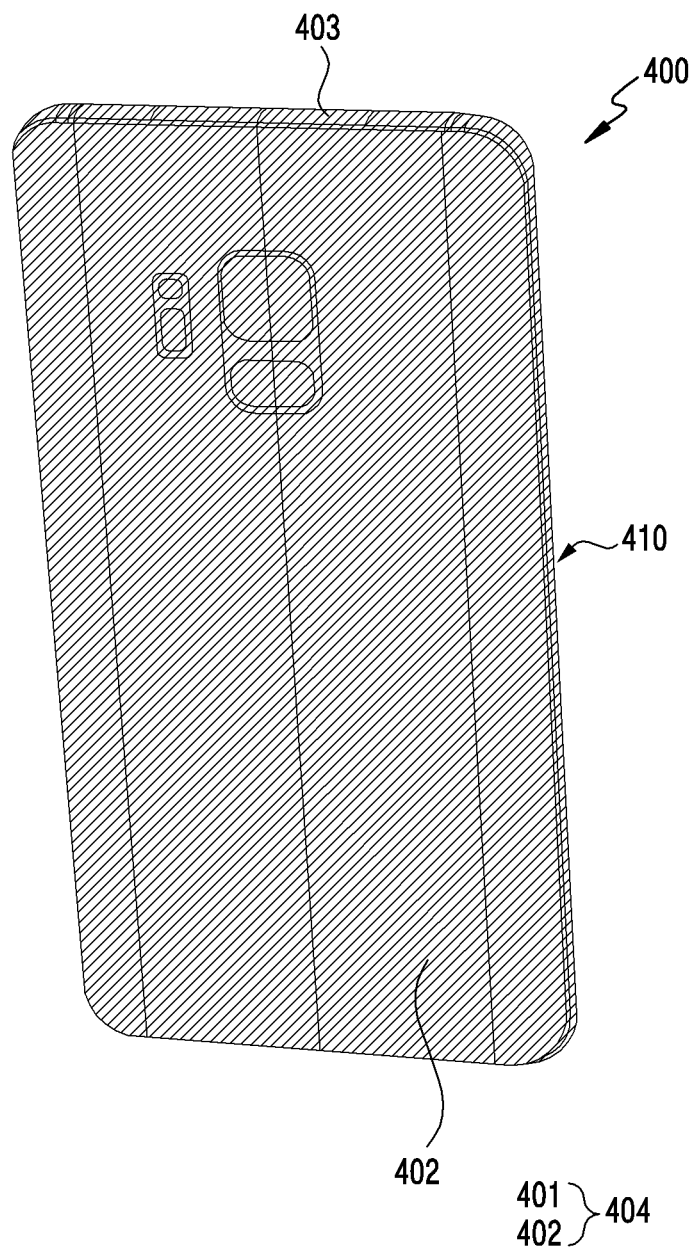
FIG. 5 is a perspective view illustrating a rear plate of an electronic device according to various embodiments.

FIG. 4 is a perspective view illustrating a front plate of an electronic device according to various embodiments of the disclosure. FIG. 5 is a perspective view illustrating a rear plate of an electronic device according to various embodiments of the disclosure.

Referring to FIG. 4 and FIG. 5, an electronic device 400 (e.g., the electronic device 100 of FIG. 1 and FIG. 2) according to various embodiments may include a housing including a front plate 401, a rear plate 402, and a side member 403. For example, the front plate 401 may be called a first cover or a front cover, and the rear plate 402 may be called a second cover, a rear cover, or a back cover. The front plate 401 or the rear plate 402 may be referred to as an outer plate 404 since the plates constitute an outer face of the housing. For example, a color structure layer may be applied to an inactive region in the front plate 401, and may be applied to the remaining region other than an optical component such as a camera, a sensor, or the like in the rear plate 402.

In the electronic device 400 according to an embodiment, the color structure layer may be located in at least some regions of the front plate 401, at least some regions of the rear plate 402, or both of them.

According to an embodiment, the front plate 401 may include a glass material or a synthetic resin material or a combination thereof. According to an embodiment, the rear plate 402 may include a glass material or a synthetic resin material or a combination thereof.

Figure 6:
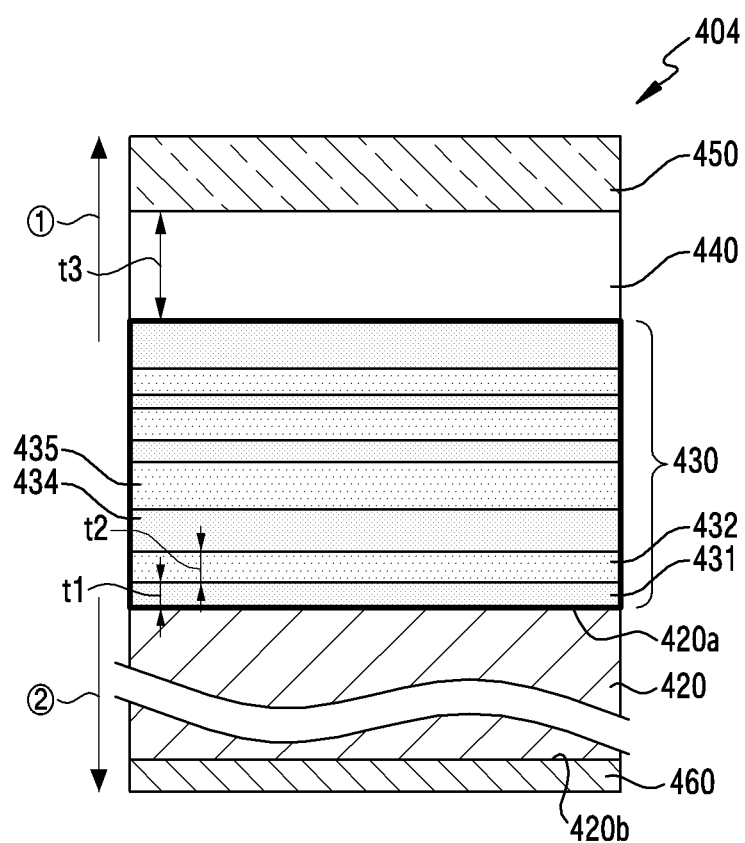
FIG. 6 is a cross-sectional view illustrating a stacked structure of an outer plate according to various embodiments of the disclosure.

FIG. 6 is a cross-sectional view illustrating a stacked structure of an outer plate according to various embodiments of the disclosure.

Referring to FIG. 6, an electronic device (e.g., the electronic device 400 of FIG. 4 and FIG. 5) according to various embodiments may include a color structure layer 430 in an outer plate 404, i.e., a front plate (e.g., the front plate 401 of FIG. 4) or a rear plate (e.g., the rear plate 402 of FIG. 5). According to an embodiment, the color structure layer 430 may be formed on a surface facing an outward direction ① of the front plate or a surface facing the outward direction ① of the rear plate.

Hereinafter, an embodiment in which the color structure layer 430 is formed on the outer plate 404 will be described as an example.

The outer plate 404 according to an embodiment may include a transparent substrate 420. For example, the transparent substrate 420 may be a glass plate constructed of a glass material. Hereinafter, the transparent substrate 420 will be referred to as a glass plate.

The glass plate 420 according to an embodiment may be constructed of a flat face or a curved face or a combination thereof. For example, if the glass plate 420 includes four edges, the curved face may be formed along one or more edges of the flat face. For example, the curved face may be formed along one edge of the flat face or two edges facing each other of the flat face or four edges. The color structure layer 430 according to an embodiment may be applied to the flat face or the curved face or the combination thereof. According to an embodiment, the glass plate 420 may include a first surface 420a facing the outward direction ① and a second surface 420b facing an inward direction ② opposite to the outward direction ①. According to an embodiment, the color structure layer 430 may be formed on the first surface 420a of the glass plate 420.

According to an embodiment, the outer plate 404 may include a coating layer 450. According to an embodiment, the coating layer 450 may be constructed by performing hydrophobic-oleophobic or hycrophibic-oleophilic processing in a wet or dry manner to have anti-finger and anti-contamination properties in an outward direction of the first surface 420a of the glass plate 420. For example, the coating layer 450 for preventing contamination may include anti-reflection coating and/or anti-finger coating. According to an embodiment, the coating layer 450 may form an outer face of the electronic device 400.

According to an embodiment, the outer plate 404 may include the color structure layer 430. According to an embodiment, the color structure layer 430 may be formed on the first surface 420a of the glass plate 420 to represent a color, for example, a color of the housing 410. According to an embodiment, the color structure layer 430 may be a prism or a Fresnel color structure layer.

According to an embodiment, the color structure layer 430 may include a first oxide layer 431 including a first inorganic material and a first nitride layer 432 including a second inorganic material different from the first inorganic material. For example, the first inorganic material may include an oxide, and the second inorganic material may include a nitride. The first inorganic material and the second inorganic material may have different refractive indices.

According to an embodiment, the first oxide layer 431 may be formed between the first surface 420a of the glass plate 420 and the coating layer 450, and may have a first thickness t1. According to an embodiment, the first nitride layer 432 may be formed between the first oxide layer 431 and the coating layer 450, and may have a second thickness t2. For example, the first thickness t1 may be the same as or different from the second thickness t2. According to an embodiment, each of the first thickness t1 and the second thickness t2 may have a value in the range of 10 nm to 300 nm.

The color structure layer 430 according to an embodiment may be formed in a structure in which the first oxide layer 431 or the first nitride layer 432 is alternately deposited and stacked, and may be formed in a multi-stacked structure depending on a desired color (or texture). Two or more types of materials such as the first oxide layer 431 or the first nitride layer 432, metal (Sn, In, etc.), non-metal (Si), and the like may be used.

For color implementation, the color structure layer 430 according to an embodiment may implement a color and a texture by selectively reflecting light in a desired wavelength range due to a spectral property of light. When the light reaches an interface between two media, part of the light may be reflected from the interface, and part of the light may be refracted by passing through a surface. In this case, the light has a different refractive index for each wavelength band, and the light may be dispersed due to occurrence of a path difference.

According to an embodiment, in a case where a dielectric of the first oxide layer 431 or the first nitride layer 432 is deposited by being stacked alternately multiple times, light is refracted when passing through an interface of each medium of the first oxide layer 431 or the first nitride layer 432, and the color structure layer 430 may adjust a thickness of each layer and the number of layers so that only light of a desired color (or texture) is selectively reflected and output. For example, the first oxide layer 431 may include $SiO_2$ and the first nitride layer 432 may include $Si_3N_4$. According to an embodiment, the first oxide layer 431 (e.g., oxide ($SiO_2$)) is a low refractive material, and has a refractive index of about 1.46 to 1.50 during thin-film coating, and may be slightly different depending on a deposition condition. The first nitride layer 432 (e.g., nitride ($Si_3N_4$)) is a high refractive material, and may be different depending on the deposition condition during thin-film coating, but has a refractive index in the ranges of 2.0 to 2.1.

According to an embodiment, the outer plate 404 may include an inorganic layer 440 including a third inorganic material to secure an anti-wear property. According to an embodiment, the inorganic layer 440 may be formed between the first nitride layer 432 and the coating layer 450, and may be formed as a layer for securing surface hardness and anti-wear properties. For example, the third inorganic material may use $Si_3N_4$, $SiN_x$, or SiN series. The inorganic layer 440 may have a third thickness t3 different from the first and second thicknesses t1 and t2. The third thickness t3 of the inorganic layer 440 may be formed to have a thickness in the range of 200 nm to 1000 nm or a thickness greater than or equal to 1000 nm in order to secure at least a specific level of hardness.

According to an embodiment, the outer plate 404 may include a second oxide layer 434 including the first inorganic material between the first nitride layer 432 and the inorganic layer 440. The second oxide layer 434 may be disposed in an outward direction of the first oxide layer 431 and may be of the same material as the first oxide layer 431. In addition, according to an embodiment, the outer plate 404 may include a second nitride layer 435 including the second inorganic material between the second oxide layer 434 and the inorganic layer 440. The second nitride layer 435 may be disposed in an outward direction of the second oxide layer 434, and may be of the same material as the first nitride layer 432.

The outer plate 404 according to an embodiment may include an opaque layer 460. According to an embodiment, the opaque layer 460 may serve for a light shielding function. According to an embodiment, the opaque layer 460 may be formed on the second surface 420b of the glass plate 420. The opaque layer 460 may have a shielding printing film or a shielding printing coating/shielding deposition structure on the second surface 420b (or a back face) of the glass plate 420, and may be combined with the color structure layer 430 to represent a color (or a texture). For example, the opaque layer 460 may include a pigment or a dye.

A shielding method may be a method in which a film subjected to shielding coating is attached to a rear face of the glass plate 420. A paint may be applied in a spray manner, or an ink may be applied in a silk printing or pad printing manner.

Figure 7:
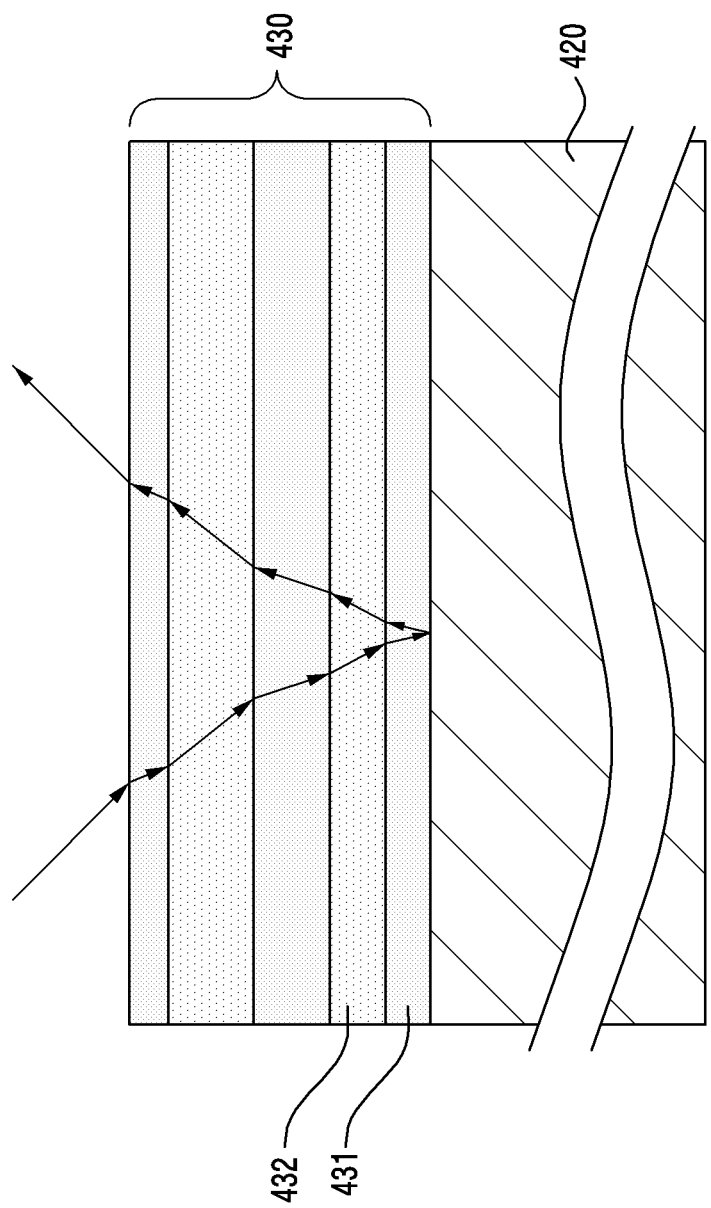
FIG. 7 is an exemplary view illustrating a state in which external light is output by being refracted/spectralized/reflected by a color structure layer according to various embodiments of the disclosure.

FIG. 7 is an exemplary view illustrating a state in which external light is output by being refracted/spectralized/reflected by a color structure layer according to various embodiments of the disclosure.

Referring to FIG. 7, in a case where a dielectric of the first oxide layer 431 or first nitride layer 432 formed on a glass plate 420 is deposited by being stacked multiple times, light is refracted when passing through an interface of a medium, and a color structure layer 430 according to an embodiment may adjust a thickness of each of the first oxide layer 431 and the first nitride layer 432 and the number of layers so that only light of a desired color (or texture) is selectively reflected and output.

Figure 8:
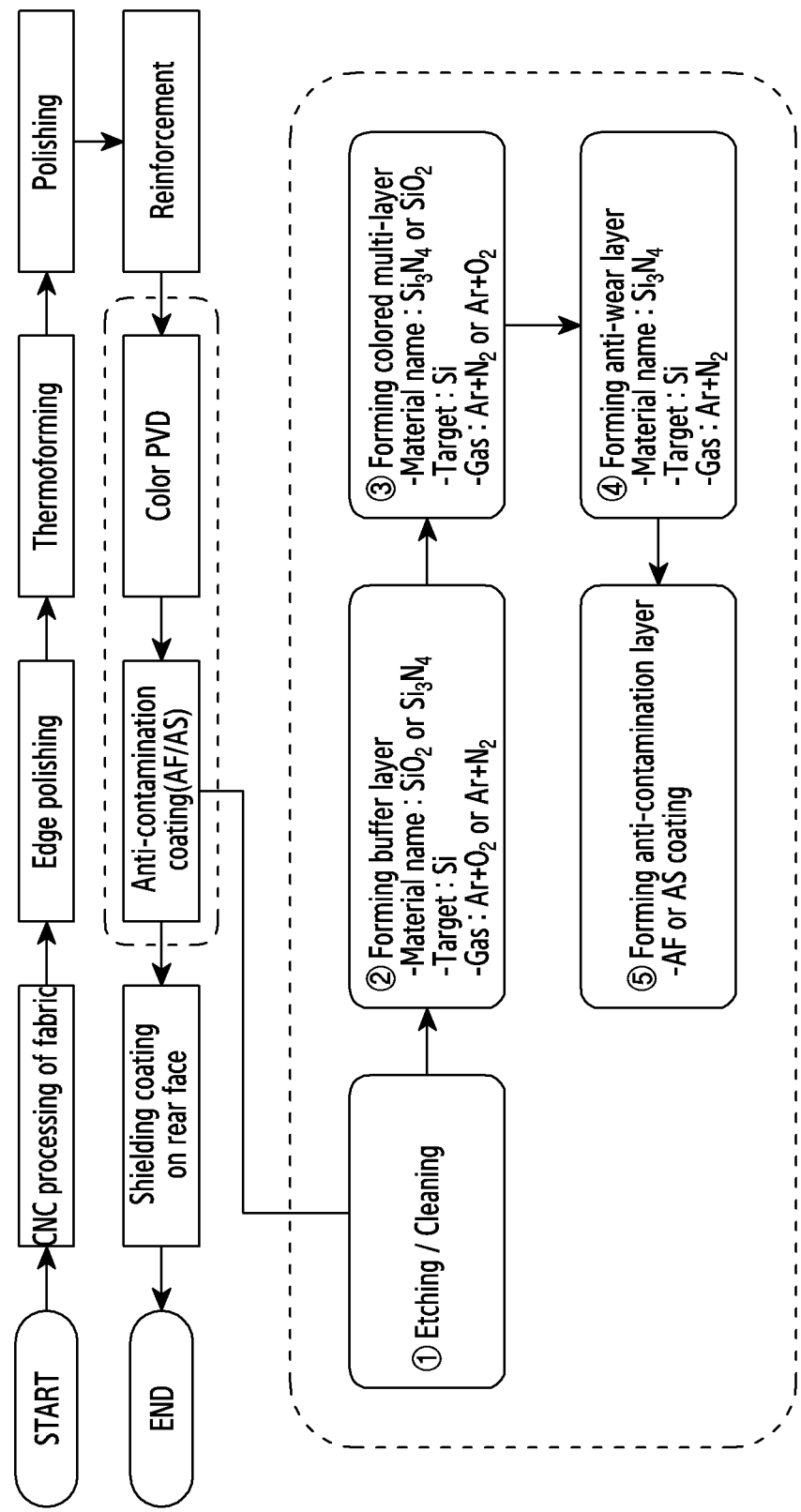
FIG. 8 is a block diagram sequentially illustrating a process of forming a color structure layer on an outer plate according to various embodiments of the disclosure.

FIG. 8 is a block diagram sequentially illustrating a process of forming a color structure layer on an outer plate according to various embodiments of the disclosure.

Referring to FIG. 8, a method of manufacturing an outer plate (e.g., the outer plate 404 of FIG. 6) including a color structure layer (e.g., the color structure layer 430 of FIG. 6) according to an embodiment is sequentially described as follows.

A glass fabric may be subjected to CNC processing to manufacture a flat glass plate. The glass plate may be subjected to a thermoforming process by using a mold after polishing processing. The glass plate may use the thermoforming process so that an edge around a flat face is formed as a curved face. After the thermoforming, the glass plate may proceed to polishing processing and surface reinforcement operations. The glass plate manufactured in this way may be colored by using a PVD method, and coating for preventing contamination may be applied on a color layer. Finally, light-shielding coating may be performed on a lower face of the glass plate to complete the manufacturing.

A process of forming a color layer and an anti-contamination layer will be described below in detail.

① Etching/Cleaning

For cleaning and surface modification (surface activation) of a glass plate (e.g., the glass plate 420 of FIG. 6), a plasma generating device may be used to perform etching and cleaning operations. For example, a glass material of the glass plate may use any one of Alkali-aluminosilicate sheet glass and sodalime glass. A surface hardness may be increased by a chemical action.

② Forming Buffer Layer

A buffer layer may be formed to attach a glass plate (e.g., the glass plate 420 of FIG. 6) and a deposition layer. The buffer layer may be coated in a sputtering manner by injecting argon (Ar) gas in a vacuum state and applying a voltage to a silicon target. In this case, the buffer layer may inject oxygen or nitrogen gas to be reacted together, in order to form an oxide film or a nitride film. In addition, the buffer layer may form the oxide film or the nitride film through oxidation or nitrification on a surface of a silicon thin film deposited by using an inductive-coupling plasma device or an ion generating device or the like.

③ Forming Color Structure Layer (Colored Multi-Layer)

$SiO_2$ and $Si_3N_4$ layers may be alternately stacked to implement a colored multi-layer on a surface of a glass plate (e.g., the glass plate 420 of FIG. 6). In order to deposit the $SiO_2$ or $Si_3N_4$ layer, the colored multi-layer may be coated by injecting argon (Ar) gas in a vacuum state and then applying a voltage to a silicon target to generate plasma. Oxygen or nitrogen gas may be injected to be reacted together, in order to form an oxide film or a nitride film. In addition, the colored multi-layer may form the oxide film or the nitride film through oxidation or nitrification on a surface of a silicon thin film deposited by using an inductive-coupling plasma device or an ion generating device or the like.

④ Forming Inorganic Layer (Anti-Wear Layer)

Figure 9A:
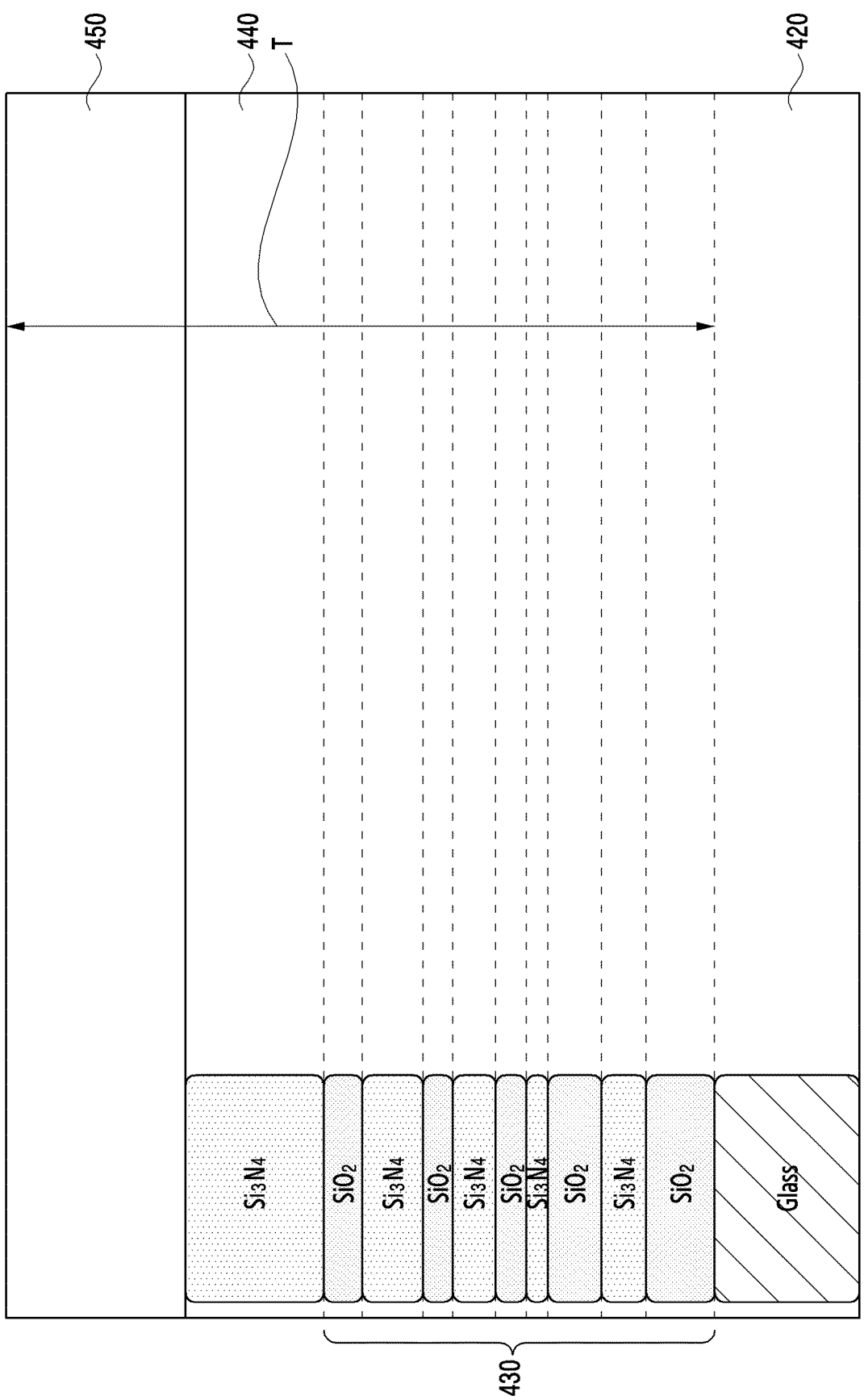
FIG. 9A is a cross-sectional view illustrating a structure of an outer plate according to various embodiments of the disclosure.
Figure 9B:
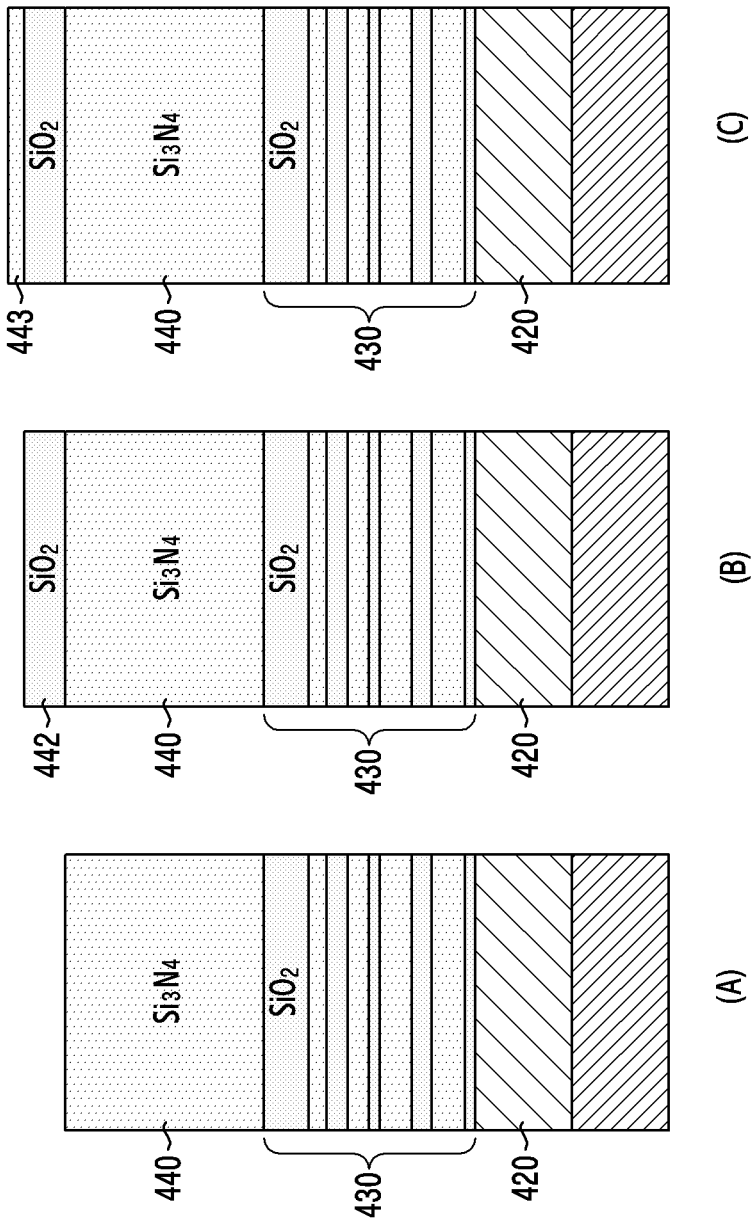
FIG. 9B is a cross-sectional view illustrating each of various deposition locations of a third layer according to various embodiments of the disclosure.

The $Si_3N_4$ or $SiN_x$ layer may be formed on the first surface (e.g., the first surface 420a of the glass plate 420 of FIG. 6) of the glass plate (e.g., the glass plate 420 of FIG. 6) to secure anti-wear, surface hardness, and strength properties. A method of forming the anti-wear layer is the same as a method of forming the colored multi-layer. The anti-wear layer may have a thickness of about 200 to 1000 nm (e.g., the third thickness t3 of FIG. 6), and a total thickness of the entire thin film including the color structure layer 430 may have a thickness of about 1000 to 2000 nm (e.g., the total thickness T of FIG. 9A). The inorganic layer 440 (e.g., anti-wear layer) may be located at an uppermost layer (e.g., shown in (a) of FIG. 9B) or a second layer (e.g., shown in (b) of FIG. 9B) or a third layer (e.g., shown in (c) of FIG. 9B) or a fourth layer or a fifth layer. According to an embodiment, the outer plate 404 may include a sixth layer 442 including an inorganic material between the inorganic layer 440 and the coating layer 450.

A method of forming the color structure layer 430 on the glass plate 420 according to an embodiment may be repeated multiple times in combination of any one or more of the processes ②, ③, and ④ according to a designed color/texture, and any one of the individual processes may be repeated multiple times.

⑤ Forming Coating Layer (Anti-Contamination Layer)

An outer surface of the deposited glass plate (e.g., the glass plate 420 of FIG. 6) may be easily contaminated by an external environment. Therefore, a coating layer, for example, an anti-contamination layer (e.g., the coating layer 450 of FIG. 6) may be formed. The coating layer 450 may use a scheme in which coating is applied to a surface by applying heat on a hydrophobic-oleophobic or hycrophibic-oleophilic material in a vacuum state.

Figure 10A:
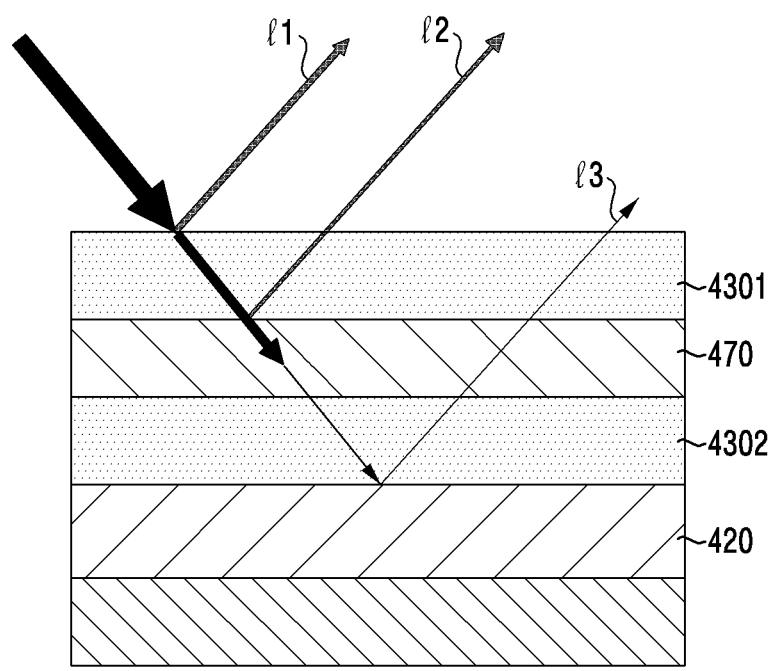
FIG. 10A is a cross-sectional view illustrating in brief an outer plate in which a light absorbing layer is inserted into an outer color structure layer according to various embodiments of the disclosure.
Figure 10B:
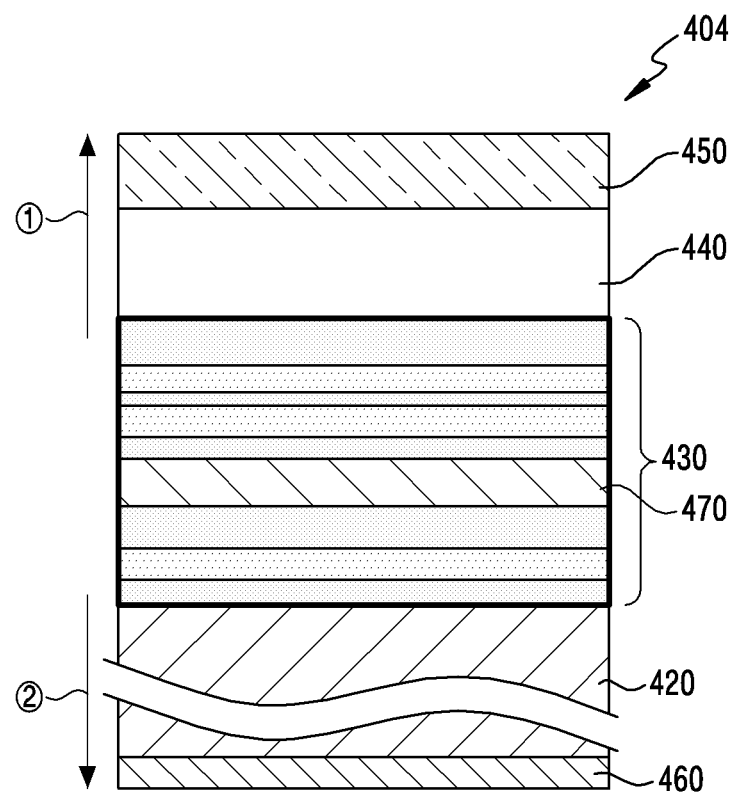
FIG. 10B is a cross-sectional view illustrating in detail an outer plate in which a light absorbing layer is inserted into an outer color structure layer according to various embodiments of the disclosure.

FIG. 10A is a cross-sectional view illustrating in brief an outer plate in which a light absorbing layer is inserted into an outer color structure layer according to various embodiments of the disclosure. FIG. 10B is a cross-sectional view illustrating in detail an outer plate in which a light absorbing layer is inserted into an outer color structure layer according to various embodiments of the disclosure.

Referring to FIG. 10A and FIG. 10B, an outer plate 404 according to an embodiment may have a light absorbing layer 470 inserted to implement a color structure layer 430 having a high hardness. According to an embodiment, the light absorbing layer 470 may include a metal layer or a non-metal layer. For example, metal may include Sn or In, and non-metal may include Si.

According to an embodiment, the color structure layer 430 may be configured by inserting the light absorbing layer, e.g., the metal (e.g., Sn, In) layer or the non-metal (e.g., Si) layer between an uppermost color structure layer 4301 and a lowermost color structure layer 4302 of a glass plate 420. At least one metal or non-metal layer may be inserted. When light is incident on the glass plate 420, the incident light may be reflected by the uppermost color structure layer 4301. The incident light may be reflected by the light absorbing layer 470. The incident light may be reflected by the lowermost color structure layer 4302. A reference numeral l1 may denote incident light reflected by the uppermost color structure layer 4301. A reference numeral l2 may denote incident light reflected by the light absorbing layer 470. A reference numeral l3 may denote incident light reflected by the glass plate 420.

According to an embodiment, the outer plate 404 is intended to form the color structure layer 430 which has a non-conductive property. When the formed color structure layer 430 is opaque (e.g., a transmittance of less than or equal to 20%) or translucent (e.g.: a transmittance of about 50%), an Sn, In, or Si layer may be inserted in the middle of the color structure layer which is a multi-layer. For example, Sn and In have a non-conductive property when a thickness is less than or equal to a specific thickness (e.g., less than or equal to about 100 nm), and it may be advantageous to implement a black-series color since light is absorbed when the three-types of materials are inserted in the middle. In addition, according to an embodiment, when the opaque or translucent color structure layer 430 is constructed, the outer plate 404 absorbs light in the middle to decrease the transmittance, which may be advantageous in designing a thin film.

Figure 11:
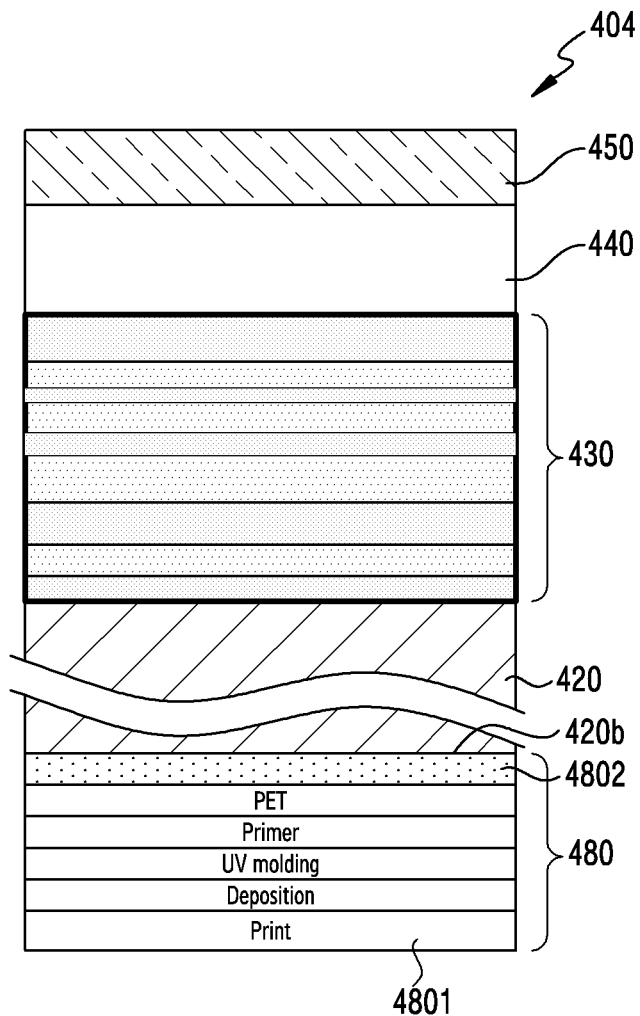
FIG. 11 is a cross-sectional view illustrating a structure of an outer plate to which a light shieling layer of a printing film structure type is applied according to various embodiments of the disclosure.

FIG. 11 is a cross-sectional view illustrating a structure of an outer plate to which a light shieling layer of a printing film structure type is applied according to various embodiments of the disclosure.

Referring to FIG. 11, according to an embodiment, a printing film structure 480 may be applied to an opaque layer (e.g., the opaque layer 460 of FIG. 6). According to an embodiment, in the printing film structure 480, a film having a printing layer 4801 formed thereon may be attached to a second surface 420b of a glass plate 420 by means of an adhesive material 4802 (e.g., OCA). For example, the film may include a PET layer, a primer layer, a UV molding layer, and a deposition layer.

Figure 12:
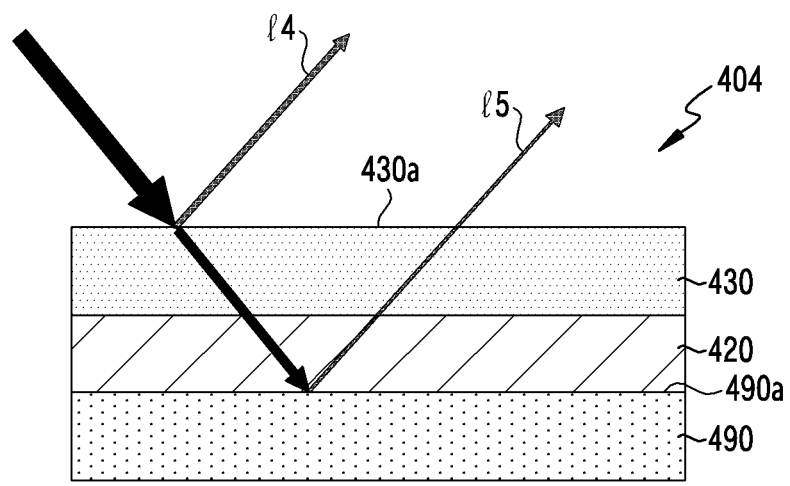
FIG. 12 is an exemplary view illustrating a principle of implementing two tones according to various embodiments of the disclosure.

FIG. 12 is an exemplary view illustrating a principle of implementing two tones according to various embodiments of the disclosure.

Referring to FIG. 12, in an outer plate 404 according to an embodiment, a color structure layer 430 formed on a first surface 420a of a glass plate 420 may be constructed as a translucent layer to form a color layer having a transmittance of about 30 to 70% and then a color printing film 490 is attached to a rear face of the glass plate 420 to be utilized when implementing a dual color texture. Since a color of reflected light l4 output from a surface 430a of the color structure layer and a color of reflected light l5 output from a surface 490a of the printing film 490 are visible together, the outer plate may be implemented with a two-tone color.

The color structure layer of the outer plate that can be additionally designed in the disclosure may implement a metal texture or a ceramic texture by applying a high-hardness deposition film on the first surface of the glass plate. To implement this, a color film having a transmittance less than or equal to 5 to 20% may be formed to implement design differentiation. A shieling film may be attached to the rear face of the glass plate, or shielding coating may be directly applied on the rear face of the glass plate.

In the disclosure, shielding may be possible in combination of the thickness of the color structure layer and the contact of materials without having to implement an opaque layer (e.g., a shielding layer) on a second face of the glass plate.

According to an embodiment, an electronic device (e.g., the electronic device 100 of FIG. 1 and FIG. 2 or the electronic device 400 of FIG. 4 and FIG. 5) includes a housing (e.g., the housing 410 of FIG. 4) including a first plate (e.g., the rear plate 402 of FIG. 5) forming an outer face. The first plate may include a glass plate (e.g., the glass plate 420 of FIG. 6) including a first surface (e.g., the first surface 420a of the glass plate of FIG. 6) outwardly facing the housing and a second surface (e.g., the second surface 420b of the glass plate of FIG. 6) inwardly facing the housing, a coating layer (e.g., the coating layer 450 of FIG. 6) including an anti-reflection coating and/or an anti-finger coating above the first surface while forming the outer face, a first layer (e.g., the first oxide layer 431 of FIG. 6) formed between the first surface of the first glass plate and the coating layer, having a first thickness (e.g., the first thickness t1 of FIG. 6), and including a first inorganic material, a second layer (e.g., the first nitride layer 432 of FIG. 6) formed between the first layer and the coating layer, having a second thickness (e.g., the second thickness t2 of FIG. 6), and including a second inorganic material different from the first inorganic material, a third layer (e.g., the inorganic layer 440 of FIG. 6) formed between the second layer and the coating layer, having a third thickness (e.g., the third thickness t3 of FIG. 6) thicker than each of the first thickness and the second thickness, and including a third inorganic material, and an opaque layer (e.g., the opaque layer 460 of FIG. 6) formed on the second surface.

According to an embodiment, the first inorganic material may include $SiO_2$, and the second inorganic material may include $Si_3N_4$.

According to an embodiment, each of the first thickness (e.g., the first thickness t1 of FIG. 6) and the second thickness (e.g., the second thickness t2 of FIG. 6) may have a value in the range of 10 nm to 300 nm.

According to an embodiment, the first inorganic material and the second inorganic material may have different refractive indices.

According to an embodiment, the third inorganic material may include at least one of $Si_3N_4$ and $SiN_x$.

According to an embodiment, the third thickness (e.g., the third thickness t3 of FIG. 6) may have a value in the range of 200 nm to 1000 nm.

According to an embodiment, the electronic device may further include a second oxide layer (e.g., the second oxide layer 434 of FIG. 6) including the first inorganic material between the first nitride layer (e.g., the first nitride layer 432 of FIG. 6) and the third layer (e.g., the inorganic layer 440 of FIG. 6), and a second nitride layer (e.g., the second nitride layer 435 of FIG. 6) including the second inorganic material between the second oxide layer and the third layer.

According to an embodiment, the electronic device may further include a sixth layer (e.g., the sixth layer 442 of FIG. 9B) including an inorganic material between the third layer and the coating layer.

According to an embodiment, the opaque layer (e.g., the opaque layer 460 of FIG. 6) may include a pigment or a dye.

According to an embodiment, an electronic device (e.g., the electronic device 100 of FIG. 1 and FIG. 2 or the electronic device 400 of FIG. 4 and FIG. 5) includes a housing (e.g., the housing 410 of FIG. 4) including an outer plate (e.g., the rear plate 402 of FIG. 5) forming an outer face. The outer plate may include a transparent substrate (e.g., the glass plate 420 of FIG. 6) including a first surface (e.g., the first surface 420a of the glass plate of FIG. 6) outwardly facing the housing and a second surface (e.g., the second surface 420b of the glass plate of the FIG. 6) inwardly facing the housing, an anti-contamination layer (e.g., the coating layer 450 of FIG. 6) formed above the first surface while forming the outer face, a color structure layer (e.g., the first and second layers 431 and 432 of FIG. 6) formed between the first surface of the transparent substrate and the anti-contamination layer, and an anti-wear layer (e.g., the inorganic layer 440 of FIG. 6) formed of an inorganic material between the color structure layer and the anti-contamination layer.

According to an embodiment, the color structure layer (e.g., the first and second layers 431 and 432 of FIG. 6) may be formed in a structure in which an oxide and a nitride are alternately stacked.

According to an embodiment, the oxide may include $SiO_2$, and the nitride may include $Si_3N_4$.

According to an embodiment, in the color structure layer (e.g., the first and second layers 431 and 432 of FIG. 6), a light absorbing layer (e.g., the light absorbing layer 470 of FIG. 10A) including a metal layer or a non-metal layer may be inserted between the oxide and the nitride. The metal layer may include Sn or In, and the non-metal may include Si.

According to an embodiment, the outer plate (e.g., the outer plate 404 of FIG. 6) may include at least part of a rear plate of the housing.

According to an embodiment, the outer plate (e.g., the outer plate 404 of FIG. 6) may be a flat face or a curved face or a combination thereof, or may include any one of a flat face including at least one edge and a curved face formed along the at least one edge.

Various embodiments of the present disclosure disclosed in the present specification and the drawing are merely a specific example presented for clarity and are not intended to limit the scope of the embodiments of the present disclosure. Therefore, in addition to the embodiments disclosed herein, various changes in forms and details made without departing from the technical concept of the various embodiments of the present disclosure will be construed as being included in the scope of the various embodiments of the present disclosure.

The invention claimed is:

1. An electronic device comprising
a housing including a first plate forming an outer face, wherein the first plate includes:
  a glass plate including a first surface outwardly facing the housing and a second surface inwardly facing the housing;
  a coating layer including an anti-reflection coating and/or an anti-finger coating above the first surface while forming the outer face;
  a color structure layer:
  wherein the color structure layer comprising:
    a first layer formed between the first surface of the first glass plate and the coating layer, having a first thickness, and including a first inorganic material;
    a second layer formed between the first layer and the coating layer, having a second thickness, and including a second inorganic material different from the first inorganic material;
  an anti-wear layer formed between the second layer and the coating layer, having a third thickness thicker than each of the first thickness and the second thickness, and including a third inorganic material; and
  an opaque layer formed on the second surface.

2. The electronic device of claim 1, wherein the first inorganic material includes $SiO_2$, and the second inorganic material includes $Si_3N_4$.

3. The electronic device of claim 1, wherein each of the first thickness and the second thickness has a value in the range of 10 nm to 300 nm.

4. The electronic device of claim 1, wherein the first inorganic material and the second inorganic material have different refractive indices.

5. The electronic device of claim 1, wherein the third inorganic material includes at least one of $Si_3N_4$ and $SiN_x$.

6. The electronic device of claim 1, wherein the third thickness has a value in the range of 200 nm to 1000 nm.

7. The electronic device of claim 1, further comprising:
  a fourth layer including the first inorganic material between the second layer and the third layer; and
  a fifth layer including the second inorganic material between the fourth layer and the third layer.

8. The electronic device of claim 7, further comprising a sixth layer including an inorganic material between the third layer and the coating layer.

9. The electronic device of claim 1, wherein the opaque layer includes a pigment or a dye.

10. An electronic device comprising a housing including an outer plate forming an outer face, wherein the outer plate comprises:

a transparent substrate including a first surface outwardly facing the housing and a second surface inwardly facing the housing;

an anti-contamination layer formed above the first surface while forming the outer face;

a color structure layer formed between the first surface of the transparent substrate and the anti-contamination layer; and an anti-wear layer formed of an inorganic material between the color structure layer and the anti-contamination layer.

11. The electronic device of claim 10, wherein the color structure layer is formed in a structure in which an oxide and a nitride are alternately stacked.

12. The electronic device of claim 11, wherein the oxide includes $SiO_2$, and the nitride includes $Si_3N_4$.

13. The electronic device of claim 12, wherein in the color structure layer, a light absorbing layer including a metal layer or a non-metal layer is inserted between the oxide and the nitride, and wherein the metal layer includes Sn or In, and the non-metal includes Si.

14. The electronic device of claim 10, wherein the outer plate includes at least part of a rear plate of the housing.

15. The electronic device of claim 10, wherein the outer plate is a flat face or a curved face or a combination thereof, or includes any one of a flat face including at least one edge and a curved face formed along the at least one edge.

* * * * *